United States Patent [19]
Chowdhury et al.

[11] Patent Number: 6,085,548
[45] Date of Patent: Jul. 11, 2000

[54] CONTROL VENT SYSTEM FOR ULTRA-HIGH PURITY DELIVERY SYSTEM FOR LIQUEFIED COMPRESSED GASES

[75] Inventors: Naser Mahmud Chowdhury, Orefield, Pa.; John Irven, High Wycombe; Dao-Hong Zheng, London, both of United Kingdom; Sukla Chandra, Calcutta, India; Kenneth Coull, Crewe, United Kingdom; Reiner Reinhard Wilhelm Taege, Heiligenhaus, Germany

[73] Assignee: Air Products and Chemicals, Inc., Allentown, Pa.

[21] Appl. No.: 09/138,489

[22] Filed: Aug. 24, 1998

[51] Int. Cl.[7] .................................................. F25J 1/00
[52] U.S. Cl. .............................................. 62/617; 62/48.2
[58] Field of Search ................................... 62/48.2, 617

[56] References Cited

U.S. PATENT DOCUMENTS

| | | | |
|---|---|---|---|
| 2,944,405 | 7/1960 | Basore et al. | 62/48.2 |
| 2,978,876 | 4/1961 | Pastuhov | 62/48.2 |
| 3,150,495 | 9/1964 | Reed | 62/48.2 |
| 3,303,660 | 2/1967 | Berg | 62/48.2 |
| 3,369,371 | 2/1968 | Holly et al. | 62/48.2 |
| 3,714,790 | 2/1973 | Battey | 62/48.2 |
| 5,426,944 | 6/1995 | Li et al. | 62/11 |
| 5,496,778 | 3/1996 | Hoffman et al. | 437/250 |
| 5,644,921 | 7/1997 | Chowdhury | 62/48.1 |

*Primary Examiner*—Ronald Capossela
*Attorney, Agent, or Firm*—Geoffrey L. Chase

[57] ABSTRACT

A control vent system is disclosed for reducing volatile impurities in a gaseous product of ultra-high purity delivered from a storage vessel containing an inventory of a non-cryogenic liquid product, as well as a method and a system for delivering the product from the storage vessel. The control vent system includes a vent line attached to the storage vessel and a condenser in the vent line. Coolant (e.g., a refrigerant) is transferred between the condenser and a source of coolant, such as a refrigeration unit. The method of reducing volatile impurities includes three steps. The first step is to vent part of the gaseous vapor from the gaseous vapor space to a condenser. The second step is to cool the vented gaseous vapor in the condenser to a temperature below the boiling point of the liquid product and above the boiling points of the volatile impurities. As a result, a first portion of the vented gaseous vapor is condensed and a second portion of the vented gaseous vapor is not condensed. The final step is to vent the second portion of the vented gaseous vapor from the condenser.

17 Claims, 1 Drawing Sheet

CONTROL VENT SYSTEM FOR ULTRA-HIGH PURITY DELIVERY SYSTEM FOR LIQUEFIED COMPRESSED GASES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention relates to a method and system for the storage and delivery of ultra-pure gases for, inter alia, semiconductor processing. In particular, the invention relates to a control vent system for reducing volatile impurities in a gaseous product of ultra-high purity delivered from a storage vessel containing an inventory of a non-cryogenic liquid product and a method and a system for delivering the product from the storage vessel.

The present invention is an improvement over the method and apparatus disclosed in U.S. Pat. No. 5,644,921 ("the '921 patent"), which is incorporated herein by reference. The '921 patent discloses a method and apparatus for storing ultra-high purity non-cryogenic liquefied compressed gases, such as ammonia ($NH_3$), and delivering a vaporized gaseous product from those liquefied gases for semiconductor processing applications.

Semiconductor manufacturers require high-purity gases and chemicals for production processes to avoid defects in the fabrication of semiconductor devices. Semiconductor fabrication facilities have in the past used electronic grades of process gases supplied in cylinders. The cylinders, which contain liquid volumes of about 40 liters, are installed in gas cabinets, which typically contain one or two such cylinders per station.

As an alternative, users of large volumes of liquefied compressed process gases have met flow demands by pumping liquid product from a storage vessel and vaporizing it prior to use. This technique enables a user to pressurize the delivery system according to their process needs. Although this method is straightforward for large-volume, low-purity users, it is more complicated for large-volume, high-purity users, such as semiconductor fabricators. Chemicals withdrawn from the liquid phase of a storage vessel contain substantially higher levels of metallic and oil contaminants than chemicals withdrawn from the vapor phase of a storage vessel. When the withdrawn liquid is vaporized, the flow stream carries the impurities into the vapor stream to the point of use. Consequently, high-purity users have in the past relied on purifiers to remove the contaminants.

The system disclosed in the '921 patent provides for vapor phase withdrawal of a non-cryogenic liquefied compressed gas (e.g., $NH_3$) from a bulk delivery source at a high flow rate without collapsing the delivery pressure. Such a vapor phase withdrawal system provides cleaner gas, since the nonvolatile impurities (e.g., oil, metal) and moisture concentrate in the liquid phase. But light impurities, such as atmospherics, partition between the liquid and gas phases of a liquefied compressed gas, whether in a cylinder, drum or tank. In general, the concentration of lights will be higher in the headspace than in the liquid, and as gas is removed form the headspace, more impurity goes into the headspace.

Direct venting of the headspace above a compressed liquid to reduce the volatile impurities is a common practice. This results in a significant loss of product, however, since the usual practice is to vent off 15–20% of a cylinder of gas to reduce the volatile impurities.

It is desired to have a more cost-effective method of delivering a gaseous product of ultra-high purity from a storage vessel containing an inventory of a non-cryogenic liquid product. It is also desired to have an improved storage vessel for reducing volatile impurities in a gaseous product of ultra-high purity delivered from the storage vessel.

It is further desired to have a method and a system which minimize product waste and provide higher purity products.

It is still further desired to have a method of delivering a gaseous product which has a lower cost for abatement.

It is still further desired to have an improved method and system to deliver ultra-pure gases to semiconductor manufacturing processes using an operationally safe, cost-effective, bulk source and delivery system.

BRIEF SUMMARY OF THE INVENTION

The present invention is a method and a system for the storage and delivery of an ultra-pure gaseous product using a control vent system for reducing volatile impurities in the gaseous product. The invention is applicable for any liquefied gas, including but not limited to $NH_3$, HF, $SiHCl_3$, $SiH_2Cl_2$, $C_4F_8$, $C_3F_8$, $Cl_2$, $C_2F_6$, $N_2O$, and the like.

The control vent system reduces volatile impurities in a gaseous product of ultra-high purity delivered from a storage vessel containing an inventory of a non-cryogenic product with a gaseous vapor space above the liquid product. In the first embodiment, the control vent system includes a vent line attached to the storage vessel and a condenser in the vent line.

In the preferred embodiment, the condenser is a shell-tube heat exchanger, and a coolant (e.g., a refrigerant) is transferred between the condenser and a source of coolant, such as a refrigeration unit.

Another aspect of the invention is a storage vessel having such a control vent system. As indicated, the vent line of the control vent system is attached to the storage vessel and the condenser is in the vent line.

A second embodiment of the invention is a method of reducing volatile impurities in a gaseous vapor in a storage vessel containing an inventory of a non-cryogenic liquid product with a gaseous vapor space above the liquid product. The method comprises three steps. The first step is to vent part of the gaseous vapor from the gaseous vapor space to a condenser. The second step is to cool the vented gaseous vapor in the condenser to a temperature below the boiling point of the liquid product and above the boiling points of the volatile impurities. As a result, a first portion of the vented gaseous vapor is condensed and a second portion of the vented gaseous vapor is not condensed. The final step is to vent the second portion of the vented gaseous vapor from the condenser.

In a third embodiment, the method of reducing the volatile impurities includes two additional steps. The first additional step is to return the condensed first portion of the vented gaseous vapor to the storage vessel. The second additional step is to repeat the three steps of the second embodiment discussed above.

A fourth embodiment is a method of delivering a gaseous product of ultra-high purity from a storage vessel containing an inventory of non-cryogenic liquid product and a gaseous vapor in a gaseous vapor space above the liquid product, the gaseous vapor containing volatile impurities. The method includes multiple steps as follows: (a) reducing the volatile impurities in the gaseous vapor; (b) withdrawing the gaseous product from the gaseous vapor space in the storage vessel; (c) heating the withdrawn gaseous product with a source of heat in excess of ambient heat; (d) passing the heated withdrawn gaseous product in heat exchange relationship with the liquid product; (e) continuing steps (b) through (d), as necessary, to vaporize the liquid product to maintain a pressure of the gaseous vapor inside the storage vessel; and (f) withdrawing the gaseous product from the storage vessel after the gaseous product has passed in heat exchange relationship with the liquid product.

In the preferred embodiment, the step of reducing the volatile impurities in the gaseous vapor [i.e., step (a)] comprises multiple sub-steps as follows: (a) venting part of the gaseous vapor from the gaseous vapor space to a condenser; (b) cooling the gaseous vapor in the condenser to a temperature below the boiling point of the liquid product and above the boiling points of the volatile impurities, whereby a first portion of the vented gaseous vapor is condensed and a second portion of the vented gaseous vapor is not condensed; (c) venting the second portion of the vented gaseous vapor from the condenser; (d) returning the condensed first portion of the vented gaseous vapor to the storage vessel; and (e) repeating sub-steps (a) through (d). Typically, the second portion of the vented gaseous vapor vented from the condenser in sub-step (c) will contain less than about 10% of the gaseous product.

A fifth embodiment is a method of delivering gaseous product as in the fourth embodiment, but includes an additional step. The additional step is to maintain a pressure of the gaseous vapor space by withdrawing gaseous product from the storage vessel and/or venting gaseous vapor from the vapor space during periods of no demand for gaseous product.

A sixth embodiment is a system for delivering a gaseous product of ultra-high purity from a storage vessel containing an inventory of a non-cryogenic liquid product in a gaseous vapor in a gaseous vapor space above the liquid product, the gaseous vapor containing volatile impurities. The delivery system includes the following features: (a) a control vent system for reducing the volatile impurities; (b) means for withdrawing the gaseous product from the storage vessel; (c) a heater to heat withdrawn gaseous product with a source of heat in excess of ambient heat; (d) a heat exchange means for exchanging heat between the heated withdrawn gaseous product and a liquid product; (e) means for withdrawing the gaseous product from the storage vessel after the gaseous product has passed in heat exchange relationship with the liquid product; and (f) pressure maintenance means for maintaining pressurized gaseous product in the storage vessel regardless of demand for product delivery and/or use.

A seventh embodiment includes means for maintaining a pressure of the gaseous vapor space by withdrawing gaseous product from the storage vessel and/or venting gaseous vapor from the vapor space during periods of no demand for gaseous product.

In the preferred embodiment of the delivery system, the control vent system includes a vent line attached to the storage vessel and a condenser in the vent line. A coolant (e.g., a refrigerant) is transferred between the condenser and a source of coolant, such as a refrigeration unit.

Another aspect of the present invention is a delivery system which also includes a second transfer means to transfer coolant between the source of coolant (e.g., a refrigeration unit) and one or more heat exchangers adjacent to one or more transfill cylinders.

DETAILED DESCRIPTION OF THE INVENTION

Figure 1:
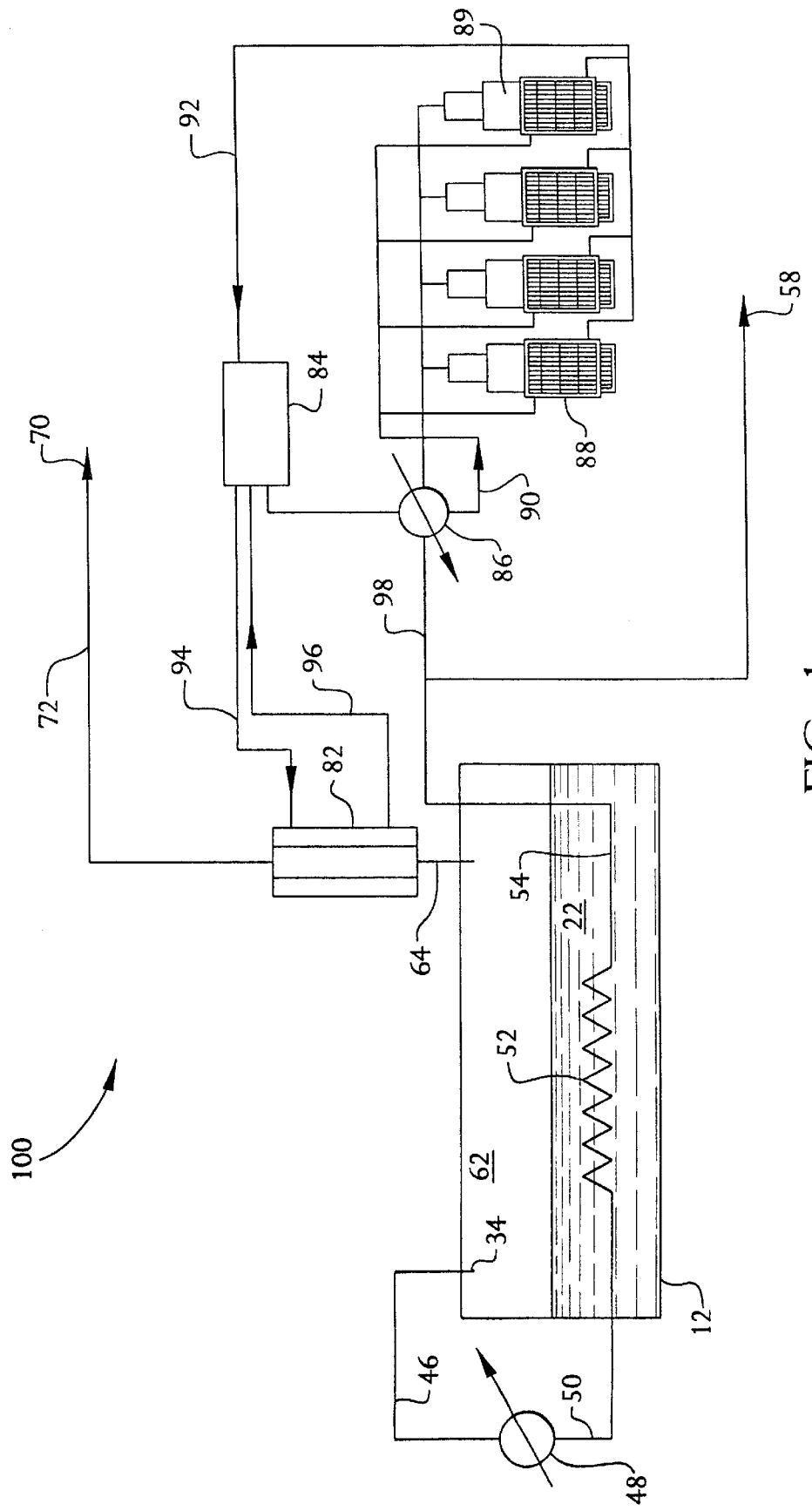
FIG. 1 is a schematic representation illustrating the present invention.

The present invention provides for delivery of ultra-high purity process gas in bulk quantities for use by semiconductor manufacturing facilities, which require increasingly larger quantities of ultra-pure chemicals due to more stringent purity requirements and processing wafers of larger diameters. Ultra-high-purity gases typically have less than one part per billion (ppb) by volume of contaminants, such as metals like aluminum, boron, iron, nickel, silver and the like. Process gases which can be delivered by the invention include, but are not limited to, $NH_3$, HF, $SiHCl_3$, $SiH_2Cl_2$, $C_4F_8$, $C_3F_8$, $Cl_2$, $C_2F_6$, $N_2O$, and the like.

The present invention is directed to non-cryogenic liquid products which can be vaporized to gaseous products using an external heater providing heat in excess of the heat available from the ambient environment. (Cryogenic liquids, those liquefying at or below −90° F., may be vaporized merely by adding ambient heat to reach acceptable delivery pressures.) Acceptable delivery pressures vary for each product in the end users' demands. For ammonia ($NH_3$), a delivery pressure of at least 50 psig (preferably 75 psig, and most preferably 100 psig) is required.

Referring to FIG. 1, the system 100 includes a storage vessel 12 which may be supported on a rack, cradle or other support (not shown) as is well-known in the art. Liquid product is introduced into the storage vessel via a fill conduit (not shown). Flow of the liquid product from the conduit to the storage vessel is regulated by one or more valves (not shown).

Various valves, pressure indicating controllers, pressure control valves, vent conduits, vent systems and vents (not shown), as are well-known in the art and disclosed in the '921 patent, are used to regulate fluid flows and pressures in the system 100 and to prevent over-pressurization of the storage vessel 12 and the withdrawal system. For example, a vent conduit (not shown) and a vent system (not shown) may be included in the system to prevent over-pressurization of the storage vessel, and a safety relief valve (not shown) may be included to prevent over-pressurization of the withdrawal system.

Storage vessel 12 includes a vapor withdrawal line or conduit 34 which delivers withdrawn vapor into another conduit 46, which in turn delivers the withdrawn vapor to a heater 48. The heater provides heat in excess of that available from ambient conditions. This could be an electric heater, a fuel-fired heater, or any other type of heater (including heat imported from an adjacent process) capable of providing heat in excess of ambient conditions.

From heater 48 the vapor passes through conduit 50 into a heat exchanger 52 (such as a multiple-pass heat exchanger like that disclosed in the '921 patent), which is disposed in liquid bath 22. The vapor is delivered from the heat exchanger 52 to conduit 54, which exits the storage vessel 12 to deliver the process gas flow to a point of use represented by arrow 58.

Heating of the liquid product in the liquid bath 22 by the vapor circulating through the heat exchanger 52 will continue to generate ultra-high purity vapor above the surface of the liquid bath in the gaseous vapor space 62 of storage vessel 12. This will maintain a constant pressure in the storage vessel. When a predetermined pressure is indicated in the vapor space by a first pressure indicating controller (not shown), heater 48 is turned off to prevent over-pressurization of the storage vessel. As long as the pressure indicating controller does not sense that the pressure inside the storage vessel has exceeded a pre-set pressure limit, the heater will continue to heat the process gas, which is withdrawn from the storage vessel through conduit 54 to the point of use 58.

The process gas flow also may be delivered to transfill cylinders or containers 89 via conduit 98, which passes through heat exchanger 86 before delivering the process gas to the transfill cylinders. The transfill cylinders are chilled by coolant which flows from refrigeration unit 84 through heat exchanger 86 via conduit 90, which transfers the refrigerant to heat exchangers 88 around or adjacent to cylinders 89. After chilling the cylinders, the coolant is returned from heat exchangers 88 to the refrigeration unit via conduit 92. As discussed below, coolant also is transferred between the refrigeration unit 84 and condenser 82.

A vent conduit 64 communicates with the gaseous vapor space 62 in storage vessel 12. This vent conduit or line 64 is attached to the storage vessel for venting gaseous vapor from the gaseous vapor space to a condenser 82. The condenser is installed in the vent line 64 to provide a control vent system for reducing volatile impurities in the gaseous vapor in the storage vessel. Before starting the bulk delivery from the storage vessel, the control vent system should be run for a period of time (e.g., 5–8 hours) to reduce the volatile impurities.

The control vent system also includes a source of coolant 84 and transfer means (94, 96) to transfer the coolant between the condenser 82 and the source of coolant. In the preferred embodiment, the coolant is a refrigerant provided from a refrigeration unit 84 to the condenser 82 via conduit 94. The refrigerant is returned to the refrigeration unit via conduit 96.

The coolant may be a cryogenic fluid or a fluorocarbon with a very low boiling point. For example, the coolant may be Freon-23 ($CHF_3$), which has a boiling point of –115.9° F. at atmospheric pressure. Other refrigerants, such as Freon-11 or Freon-12, also may be used.

In the preferred embodiment, the condenser 82 is a shell-tube heat exchanger.

When gaseous vapor is vented to the condenser 82, the gaseous vapor is cooled to a temperature below the boiling point of the liquid product and above the boiling points of the volatile impurities. As a result, a portion of the vented gaseous vapor is condensed and returned to the storage vessel 12 via conduit 64. The remaining portion is vented from the condenser 82 to an abatement system 70 (not shown) via a venting conduit 72. The vented portion typically will contain less than about 10% of the gaseous product. The abatement system can include a scrubbing system or any other system or receptacle for safe disposal of vented gases.

The vent conduit 64, heater 48, conduit 50, heat exchanger 52, and conduit 54, coupled with various valves (not shown), a second pressure indicating controller (not shown), and additional conduit (not shown) provide a pressure maintenance system similar to that disclosed in the '921 patent.

As a test, a series of chlorine cylinders were purified using the control vent of the present invention, with the temperature of the condenser 82 kept at 14° F. Typical impurity levels in the standard unpurified cylinders were as follows:

| Typical unpurified cylinder analyses | | | | |
|---|---|---|---|---|
| Cyl number | $H_2$ ppm | $O_2$ ppm | $N_2$ ppm | $CO_2$ ppm |
| 328214 | 134 | 2 | 63 | 41 |
| 04129 | 3 | >100 | >50 | 50 |
| 328016 | 25 | >100 | >50 | 25 |

After 5–8 hours of venting, nearly all of the volatile impurities were eliminated, as shown by the following tabulated results of production trials:

| Cyl number | Initial weight (kg) | Vented product (kg) | Vent time (hours) |
|---|---|---|---|
| 578573 | 25 | 1.3 | 5.73 |
| 539280 | 25 | 1.2 | 5.83 |
| 424921 | 25.1 | 1.1 | 5.85 |
| 419868 | 25.4 | 1.8 | 5.98 |
| 539784 | 25.2 | 2.5 | 6.28 |
| 19815 | 19.8 | 2.0 | 6.2 |
| 19859 | 19.8 | 1.8 | 5.93 |
| 64200 | 19.8 | 1.9 | 6.12 |

The levels of impurities ($H_2$, $O_2$, $N_2$, and $CO_2$) after 5–8 hours of venting were:

| | Purified Atmospherics | | | | |
|---|---|---|---|---|---|
| Cyl number | Cyl capacity in water liters | $H_2$ ppm | $O_2$ ppm | $N_2$ ppm | $CO_2$ ppm |
| 578573 | 47 'K' size | 0 | 21 | 21 | 0 |
| 539280 | 47 'K' size | 0 | 2 | 6 | 0 |
| 424921 | 47 'K' size | 0 | 2 | 6 | 0 |
| 419868 | 47 'K' size | 0 | 1 | 8 | 0 |
| 539784 | 47 'K' size | 0 | 2.5 | 7 | 0 |
| 19815 | 16 'C' size | 0 | 8 | 19 | 0 |
| 19859 | 16 'C' size | 0 | 4 | 21 | 0 |
| 64200 | 16 'C' size | 0 | 10 | 23 | 0 |

Similar results would be obtained for any non-cryogenic liquefied gas. Therefore, before starting bulk delivery from storage vessel 12, the control vent system should be run for an appropriate period of time (5–8 hours) to reduce the volatile impurities.

The method and apparatus according to the present invention are advantageous to users of high-purity compressed liquefied gases for several reasons. First, by delivering ultra-pure gas in bulk quantities, the invention eliminates the need for users to maintain numerous cylinders and gas cabinets, which minimizes the number of components (e.g., valves, regulators, instruments, fittings, etc.) and reduces equipment cost, product cost, and operating labor by eliminating numerous cylinder changes. The invention further eliminates equipment cost by eliminating the need for a purifier. Second, unlike a conventional pressure building circuit that vaporizes liquid and reinjects it into the vapor space of the vessel, the invention maintains separation of vapor and liquid spaces at all times. This separation enables the impurity concentration in the vapor space to be continually lower than that in the liquid space. Third, since the process gas is used as the heat exchange media, mechanical problems associated with the heat exchange tubes do not compromise the purity of the product, as would be the case if any other heat exchange fluid were used.

Also, the duty of the abatement system 70 and the loss of product through the abatement system are relatively low when the present invention is used. Less than 10% of product loss via the abatement system is typically experienced for delivery systems using the present invention, whereas losses of 30% or more are not uncommon for competing delivery systems.

Various embodiments of the present invention have been described above. However, it will be appreciated that variations and modifications may be made to those embodiments within the scope of the appended claims.

SEQUENCE LISTING

Not applicable.

What is claimed is:

1. A control vent system for reducing volatile impurities in a gaseous product of ultra-high purity delivered from a storage vessel containing an inventory of a non-cryogenic liquid product with a gaseous vapor space above the liquid product, comprising:

a means for withdrawing said gaseous product from said storage vessel as a product;

a vent line attached to the storage vessel for venting gaseous vapor from the gaseous vapor space;

condenser in the vent line;

a venting conduit from said condenser to vent said volatile impurities from said storage vessel;

a source of coolant; and transfer means to transfer coolant between the condenser and the source of coolant.

2. A control vent system as in claim 1, wherein the coolant is a refrigerant.

3. A control vent system as in claim 1, wherein the condenser is a shell-tube heat exchanger.

4. A control vent system as in claim 1, wherein the liquid product is selected from the group consisting of $NH_3$, HF, $SiHCl_3$, $SiH_2Cl_2$, $C_4F_8$, $C_3F_8$, $Cl_2$, $C_2F_6$, and $N_2O$.

5. A method of reducing volatile impurities in a gaseous vapor in a storage vessel containing an inventory of a non-cryogenic liquid product with a gaseous vapor space above the liquid product and having a vapor withdrawal line for gas product, comprising the steps of:

(a) venting part of the gaseous vapor from the gaseous vapor space through a vent conduit to a condenser;

(b) cooling the vented gaseous vapor in the condenser to a temperature below the boiling point of the liquid product and above the boiling points of the volatile impurities, whereby a first portion of the vented gaseous vapor is condensed and a second portion of the vented gaseous vapor is not condensed; and (c) venting the second portion of the vented gaseous vapor from the condenser.

6. A method of reducing volatile impurities as in claim 5, further comprising the steps of:

(d) returning the condensed first portion of the vented gaseous vapor to the storage vessel; and (e) repeating steps (a) through (d).

7. A method of reducing volatile impurities as in claim 5, wherein the liquid product is selected from the group consisting of $NH_3$, HF, $SiHCl_3$, $SiH_2Cl_2$, $C_4F_8$, $C_3F_8$, $Cl_2$, $C_2F_6$ and $N_2O$.

8. A method of delivering a gaseous product of ultra-high purity from a storage vessel containing an inventory of a non-cryogenic liquid product and a gaseous vapor in a gaseous vapor space above the liquid product, the gaseous vapor containing volatile impurities, comprising the steps of:

(a) reducing the volatile impurities in the gaseous vapor;

(b) withdrawing the gaseous product from the gaseous vapor space in the storage vessel;

(c) heating the withdrawn gaseous product with a source of heat in excess of ambient heat;

(d) passing the heated withdrawn gaseous product in heat exchange relationship with the liquid product;

(e) continuing steps (b) through (d) as necessary to vaporize the liquid product to maintain a pressure of the gaseous vapor inside the storage vessel; and (f) withdrawing the gaseous product from the storage vessel after the gaseous product has passed in heat exchange relationship with the liquid product, wherein the step of reducing the volatile impurities in the gaseous vapor comprises the sub-steps of:

(g) venting part of the gaseous vapor from the gaseous vapor space to a condenser;

(h) cooling the vented gaseous vapor in the condenser to a temperature below the boiling point of the liquid product and above the boiling points of the volatile impurities, whereby a first portion of the vented gaseous vapor is condensed and a second portion of the vented gaseous vapor is not condensed;

(i) venting the second portion of the vented gaseous vapor from the condenser;

(j) returning the condensed first portion of the vented gaseous vapor to the storage vessel.

9. A method of delivering a gaseous product as in claim 8, further comprising the step of maintaining a pressure of the gaseous vapor space by withdrawing gaseous product from the storage vessel and/or venting gaseous vapor from the vapor space during periods of no demand for gaseous product.

10. A method of delivering gaseous product as in claim 8, wherein the liquid product is selected from the group consisting of $NH_3$, HF, $SiHCl_3$, $SiH_2Cl_2$, $C_4F_8$, $C_3F_8$, $Cl_2$, $C_2F_6$, and $N_2O$.

11. A method of delivering gaseous product as in claim 8, wherein the second portion of the vented gaseous vapor vented from the condenser contains less than about 10% of the gaseous product.

12. A system for delivering a gaseous product of ultra-high purity from a storage vessel containing an inventory of a non-cryogenic liquid product and a gaseous vapor in a gaseous vapor space above the liquid product, the gaseous vapor containing volatile impurities, comprising:

a control vent system for reducing the volatile impurities comprising; a vent line attached to the storage vessel for venting gaseous vapor from the gaseous vapor space, a condenser in the vent line, a venting conduit from said condenser to vent said volatile impurities from said storage vessel, a source of coolant and transfer means to transfer coolant between the condenser and the source of coolant;

means for withdrawing the gaseous product from the storage vessel;

a heater to heat withdrawn gaseous product with a source of heat in excess of ambient heat;

heat exchange means for exchanging heat between the heated withdrawn gaseous product and the liquid product;

means for withdrawing the gaseous product from the storage vessel after the gaseous product has passed in heat exchange relationship with the liquid product; and pressure maintenance means for maintaining pressurized gaseous product in the storage vessel regardless of demand for product delivery and/or use.

13. A system for delivering a gaseous product as in claim 12, further comprising means for maintaining a pressure of the gaseous vapor space by withdrawing gaseous product from the storage vessel and/or venting gaseous vapor from the vapor space during periods of no demand for gaseous product.

14. A system for delivering a gaseous product as in claim 12, further comprising:
another transfer means to transfer coolant between the source of coolant and at least one heat exchanger adjacent at least one transfill cylinder.

15. A system for delivering gaseous product as in claim 12, wherein the liquid product is selected from the group consisting of $NH_3$, HF, $SiHCl_3$, $SiH_2Cl_2$, $C_4F_8$, $C_3F_8$, $Cl_2$, $C_2F_6$, and $N_2O$.

16. A system for delivering a gaseous product of ultra-high purity including a storage vessel adapted to contain a non-cryogenic liquid product and the gaseous product under pressure in a gaseous vapor space above the liquid product, means to withdraw the gaseous product from the storage vessel, heater means to heat the withdrawn gaseous product with a source of heat in excess of ambient heat, heat exchange means to exchange heat between the heated withdrawn gaseous product and the liquid product, means to deliver the gaseous product after heat exchange with the liquid product to a point of use, pressure maintenance means to maintain pressurized gaseous product in the storage vessel regardless of demand for product delivery and/or use, and means to vent withdrawn gaseous product in the event of no demand for delivery or use of gaseous product, the improvement comprising:
a vent line attached to the storage vessel for venting gaseous vapor from the gaseous vapor space;
a condenser in the vent line;
a venting conduit from said condenser to vent volatile impurities from said storage vessel;
a source of coolant; and
transfer means to transfer coolant between the condenser and the source of coolant.

17. A storage vessel for containing an inventory of a non-cryogenic liquid product with a gaseous vapor space above the liquid product with a means for withdrawing gaseous product from said storage vessel as a product, the storage vessel having a control vent system for reducing volatile impurities in a gaseous product of ultra-high purity delivered from the storage vessel, wherein the control vent system comprises:
a vent line attached to the storage vessel for venting gaseous vapor from the gaseous vapor space;
a condenser in the vent line;
a venting conduit from said condenser to vent said volatile impurities from said storage vessel;
a source of coolant; and
transfer means to transfer coolant between the condenser and the source of coolant.

* * * * *